United States Patent [19]

Crossley

[11] 4,277,882
[45] Jul. 14, 1981

[54] METHOD OF PRODUCING A METAL-SEMICONDUCTOR FIELD-EFFECT TRANSISTOR

[75] Inventor: Peter A. Crossley, Garden Grove, Calif.

[73] Assignee: Fairchild Camera and Instrument Corporation, Mountain View, Calif.

[21] Appl. No.: 966,182

[22] Filed: Dec. 4, 1978

[51] Int. Cl.³ .................... B01J 17/00; H01L 21/265
[52] U.S. Cl. ..................................... 29/571; 29/578;
 357/15; 357/42; 357/91; 148/1.5; 148/187;
 427/84
[58] Field of Search ............... 29/571, 578; 357/15,
 357/42; 148/1.5, 187; 427/84; 359/91

[56] References Cited

U.S. PATENT DOCUMENTS

| | | | |
|---|---|---|---|
| 3,912,546 | 10/1975 | Hunsperger | 357/15 |
| 3,921,283 | 11/1975 | Shappir | 357/42 |
| 4,013,483 | 3/1977 | Nuzillat | 357/15 |
| 4,122,481 | 10/1978 | Horie | 357/42 |
| 4,160,987 | 7/1979 | Dennard | 29/571 |

*Primary Examiner*—R. Dean
*Assistant Examiner*—W. G. Saba
*Attorney, Agent, or Firm*—Paul J. Winters; Theodore S. Park; Ronald J. Meetin

[57] ABSTRACT

A metal-semiconductor field-effect transistor is formed by providing a blanket layer of the same conductivity type as the semiconductor body, with field oxide subsequently being grown, and with a region of opposite conductivity type being formed to extend partially under the field oxide, the initial blanket layer acting as the field implant region of the field-effect transistor.

4 Claims, 6 Drawing Figures

METHOD OF PRODUCING A METAL-SEMICONDUCTOR FIELD-EFFECT TRANSISTOR

BACKGROUND OF THE INVENTION

This invention relates to field-effect transistors, and more particularly to a Schottky-barrier-gate field-effect transistor including field oxide.

In the formation of a Schottky-barrier-gate field-effect transistor including a field oxide, serious problems have been presented. Generally, it has been found necessary to use a first mask for field ion implantation, and a second, smaller mask for field oxide growth, to ensure that the region of field ion implantation is spaced from the conductive gate portion which contacts the semiconductor body. This is so because contact of the gate with the field ion implantation region would provide shorting out of the device.

The necessity for using two separate masking techniques results in alignment problems of the oxide and field ion implantation regions. Use of the same mask for field ion implantation and also for growth of field oxide would result in the above described undesirable contact between the field ion implantation region and the conductive gate.

For these reasons, Schottky-barrier-gate field-effect transistors are generally not formed with field oxide, as are, for example, metal-oxide-semiconductor transistors. Rather the gate of the typical Schottky-barrier-gate field-effect transistor is a large, continuous member completely surrounding the drain and in turn being substantially surrounded by the source. (See, for example, "Femto Joule Logic Circuit With Enhancement-Type Schottky Barrier Gate FET," by Muta et al., IEEE Transactions on Electron Devices, Vol. ED-23, No. 9, September 1976, pages 1023-1027. See also "Si and GaAs 0.5 μm-gate Schottky-Barrier Field-Effect Transistors," W. Baechtold et al., Electronics Letters, May 17, 1973, Vol. 9, No. 10, pages 232-234, and "Microwave Silicon Schottky-Barrier Field-Effect Transistor," K. E. Drangeid et al., Electronics Letters, August 23, 1968, Vol 4, No. 17, pages 362-363.)

Obviously, such transistors are relatively inefficient in the use of wafer area.

SUMMARY OF THE INVENTION

It is accordingly an object of this invention to overcome the above problems by providing a properly formed Schottky-barrier-gate field-effect transistor including field oxide.

Broadly stated, the invention is a method of producing a field-effect transistor providing a semiconductor body of one conductivity type, and forming a region of said one conductivity type along a surface of the body but of a higher impurity concentration than the semiconductor body. The method further includes the step of providing electrically insulating material on a portion of the body over a portion of the region of the one conductivity type, leaving a portion of the region of the one conductivity type uncovered by the electrically insulating material. Further, the method includes the step of forming a region of conductivity type opposite to the one conductivity type in the body along the surface thereof adjacent the electrically insulating material and extending under a portion of the electrically insulating material, providing a conductive gate in contact with the region of opposite conductivity type and the electrically insulating material and not in contact with any region of the one conductivity type, and forming source and drain regions in the region of opposite conductivity type.

BRIEF DESCRIPTION OF THE DRAWINGS

Other objects of the invention will become apparent from a study of the following specification and drawings, in which.

DETAILED DESCRIPTION

Figure 1:
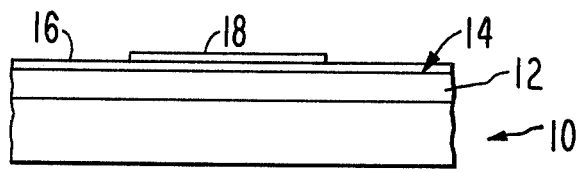
FIGS. 1-6 illustrate the process of the invention.

Shown in FIG. 1 is a semiconductor substrate or body 10 which in this embodiment is of monocrystalline p-type silicon. Such semiconductor body has formed along a surface thereof a blanket layer or region 12. The region 12 is formed by ion implantation of impurities, for example, boron, in this particular embodiment, and extends along the entire surface 14 of the body with a surface concentration of $1 \times 10^{12}$ boron atoms/cm$^2$, so that the region is more highly p doped than the remainder of the body 10. The substrate then has formed on it a thin oxide layer 16 by, for example, thermal oxidation of the body 10. A thin layer of silicon nitride 18 is formed over the oxide layer 16. Photoresist is applied to the nitride layer 18 and such nitride layer 18 is then etched, and the photoresist removed, as is well known, to provide the resulting structure as shown in FIG. 1.

Figure 2:
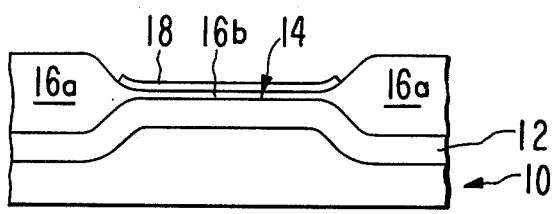

Next, the structure of FIG. 1 is placed in an oxidizing environment at an elevated temperature. The oxygen in the environment combines with the silicon from the body 10 beneath those portions of the oxide not covered by nitride to form thick field oxide regions 16a on the body 10 which grow into the body 10 (FIG. 2). During the high-temperature thermal oxidation process, portions of the region 12 under the field oxide 16a migrate further into the silicon semiconductor body 10. This migration occurs both because of the different diffusivities and segregation coefficients of the conductivity-determining impurities in those regions as opposed to silicon dioxide and the prolonged high temperature.

The formation of the thick field oxide 16a is followed by the removal of nitride. The entire exposed oxide is then etched to remove the thin portion 16b of the oxide, the thickness of the field oxide portions 16a also being slightly reduced.

Figure 4:
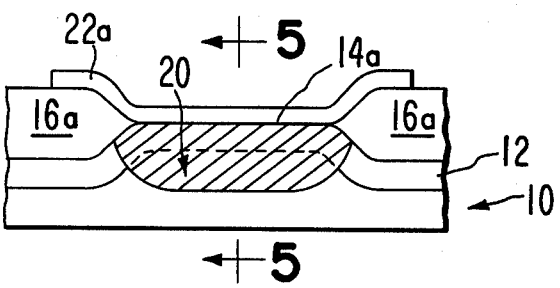
Figure 5:
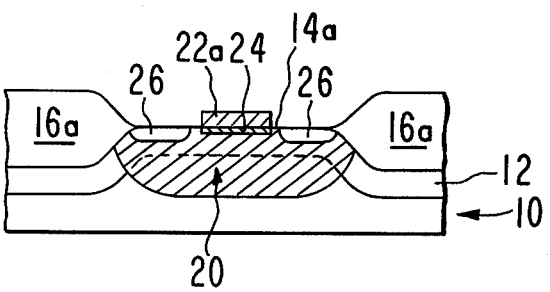
Figure 6:
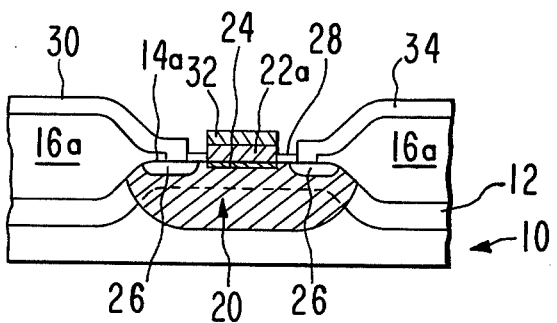

The thick oxide portions 16a making up the field oxide actually surrounds a now-exposed surface portion 14a of body 10, leaving that surface portion 14a of the body 10 uncovered which was previously covered by the thin oxide layer 16b (see FIGS. 4 and 5). Such surface 14a portion is actually a surface portion of the boron-implanted layer 12.

At this point, a phosphorus ion implantation takes place, to form an n-region of conductivity type opposite to the conductivity type of the region 12 and remainder of the semiconductor body 10. The dosage is sufficient to change the portion of the body not covered by field oxide 16a into the opposite conductivity type. (For example, a desirable surface concentration of phosphorus atoms might be $2.4 \times 10^{12}$ atoms/cm$^2$). This region of opposite conductivity type lies along the surface 14a and extends under the surrounding field oxide 16a, so that the entire shaded region 20 (FIG. 3) is of the opposite (n) conductivity type. As is seen in FIGS. 3-6, the region 20 extends through region 12 into that portion of the semiconductor body 10 of lower impurity concentration beneath the region 12.

Figure 3:
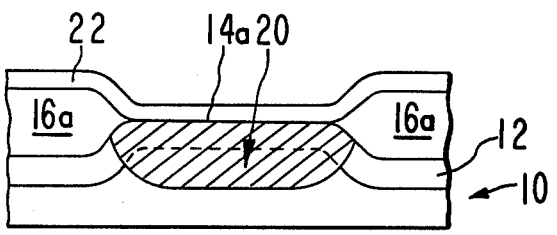

Platinum 22 is then deposited over the entire surface of the thus-far-formed structure, resulting in the structure shown in FIG. 3.

The platinum 22 is then etched to form a gate 22a the shape of which is shown in FIGS. 4 and 5. Such gate 22a is in contact with portions of the field oxide 16a and also with the surface 14a of the region of opposite (n) conductivity type 20, but it will be seen that because of the particular steps sets forth above, the gate 22a is not in contact with any region of the first (p) conductivity type. Thus, no shorting-out of the overall apparatus as described in the above discussion can take place.

Heat is applied to the apparatus to form a platinum-silicide gate portion 24, and by appropriate masking steps, highly doped n-type source and drain regions are formed through diffusion or ion implantation (FIG. 5). The resulting structure is then appropriately masked and oxidized to form a thin oxide layer 28 over the source and drain and extending to the gate. Openings are then provided in the thin oxide layer by etching, and contacts 30, 32, 34 are provided, in contact with the source, gate and drain, respectively, to provide a finished Schottky-barrier-gate field-effect transistor.

It will thus be seen that because of the formation of a blanket layer or region 12, part of which becomes the field oxide ion implantation region, growth of field oxide 16a, and subsequent implantation of impurities of the opposite (n) conductivity type to form the region 20, the field oxide 16a acts as the mask for providing proper positioning of the region 20 of opposite (n) conductivity type to preclude shorting-out between the gate 22a and the field oxide ion implantation region. It will readily be seen that the problem of providing this feature through the use of multiple masking steps, with the alignment problems attendant thereto, does not exist.

What is claimed is:

1. A method of producing a Schottky-barrier, field-effect transistor comprising:

providing a semiconductor body of one conductivity type and a low impurity concentration;

forming an ion implantation layer of said one conductivity type through the surface of said body, said ion implantation layer having a higher impurity concentration than said semiconductor body;

oxidizing said surface of the body to provide an electrically insulating oxide layer portion of said body over the ion implantation layer;

masking an area of said insulating oxide layer wherein said area is surrounded by an exposed portion thereof;

oxidizing the body again at a high temperature to increase the thickness of the exposed portion of said insulating oxide layer to form a field oxide layer;

removing the mask and said thin oxide thereunder to expose a region of higher impurity beneath the area previously covered by the mask;

forming a region of opposite conductivity type opposite to said one conductivity type in said body in the exposed region and extending the region of opposite conductivity type under a portion of oxide layer and into the semiconductor body beneath the ion implantation layer;

providing a conductive gate forming a Schottky junction with an exposed portion of the region of opposite conductivity type and extending over the field oxide layer but not in contact with any region of said one conductivity type; and forming source and drain regions in said region of opposite conductivity type adjacent said gate.

2. The method of claim 1 wherein said electrically insulating field oxide layer is used as a mask in forming the region of opposite conductivity type and wherein the region of opposite conductivity type is formed by ion implantation.

3. The method of claim 2 wherein the region of opposite conductivity type is formed by ion implantation.

4. The method of claim 3 wherein the electrically insulating material is an oxide material grown into the semiconductor body.

* * * * *